(12) United States Patent
Ishifune et al.

(10) Patent No.: US 7,113,389 B2
(45) Date of Patent: Sep. 26, 2006

(54) SURFACE MOUNTED ELECTRONIC COMPONENT

(75) Inventors: Michiru Ishifune, Chuo-ku (JP); Yoji Tozawa, Chuo-ku (JP); Toshiyuki Anbo, Chuo-ku (JP); Hidekazu Sato, Chuo-ku (JP); Shuumi Kumagai, Chuo-ku (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/149,304

(22) Filed: Jun. 10, 2005

(65) Prior Publication Data
US 2006/0007640 A1    Jan. 12, 2006

(30) Foreign Application Priority Data
Jul. 7, 2004    (JP) .............................. 2004-200977

(51) Int. Cl.
*H01G 4/228* (2006.01)
*H01G 2/20* (2006.01)

(52) U.S. Cl. ................................. 361/306.3; 361/308.1

(58) Field of Classification Search ............ 361/306.1, 361/306.3, 306.9, 308.1, 311–313; 336/83, 336/200, 192; 338/309, 313
See application file for complete search history.

(56) References Cited

U.S. PATENT DOCUMENTS 5,712,758 A * 1/1998 Amano et al. ........... 361/321.2

FOREIGN PATENT DOCUMENTS

| JP | 06-267780 | * | 9/1994 |
| JP | 11-233374 | * | 8/1999 |
| JP | 2001-284157 | * | 12/2001 |
| JP | 3340625 B2 | | 8/2002 |
| JP | 2003-209024 | * | 7/2003 |

* cited by examiner

*Primary Examiner*—Eric W. Thomas
(74) *Attorney, Agent, or Firm*—Oliff & Berridge, PLC

(57) ABSTRACT

A multilayer inductor has a rectangular parallelepiped element body and its length in the lengthwise direction (L), length in the direction of height (H), and length in the direction of width (W) are L≦0.6 mm, H≦0.3 mm, and W≦0.3 mm, respectively. Terminal electrodes are provided so as to cover the vertices of the element body and come round to the side face from the end faces on both sides. The radius of curvature R of the vertex of the terminal electrode is set to a value being 10% or more and 20% or less of H or W.

2 Claims, 3 Drawing Sheets

(a)

(b)

SURFACE MOUNTED ELECTRONIC COMPONENT

BACKGROUND OF THE INVENTION

1. Field of the Invention

The present invention relates to a surface mounted electronic component.

2. Related Background Art

Recently, there has been a high demand for reduction in size of an electronic component to make an electronic device more compact. Particularly, reduction in size is being developed for a surface mounted electronic component, which is mounted on the surface of a mounting substrate. As the surface mounted electronic component, a multilayer ceramic capacitor having a rectangular parallelepiped ceramic element body and terminal electrodes provided on both ends in the lengthwise direction of the ceramic element body is known. The dimensions of the ceramic element body are 0.6 mm×0.3 mm×0.3 mm. The multilayer ceramic capacitor is an electronic component of so-called 0603 type and its outside dimensions are small and the mass is very light.

SUMMARY OF THE INVENTION

By the way, as shown in FIG. 3, a surface mounted electronic component 101 of this kind is mounted on a surface, for example, through a reflow soldering process in which respective terminal electrodes 102 are soldered on the respective pads of a mounting substrate. Because of the light mass, the surface mounted electronic component 101 is likely to move on the melted solder during the process of reflow soldering. Due to this, as shown in FIG. 3(a), there is a case where the surface mounted electronic component 101 rotates in the direction parallel to a mounting substrate 103 or a case where, as shown in FIG. 3(b), the surface mounted electronic component 101 rises up on the mounting substrate 103. In particular, if solder 105 hardens in a state in which the surface mounted electronic component 101 rises up on the mounting substrate 103, an electrical connection between the surface mounted electronic component 101 and a pad 107 is broken. As a result, the function of the surface mounted electronic component 101 on the mounting substrate 103 is lost. As described above, there has been the possibility that such an electronic component with small outside dimensions causes defective mounting owing to its light mass.

An object of the present invention is to provide a surface mounted electronic component capable of suppressing the occurrence of the occurrence of defective mounting.

A surface mounted electronic component according to the present invention comprises a rectangular parallelepiped element body whose length in the lengthwise direction (L), length in the direction of height (H), and length in the direction of width (W) are L≦0.6 mm, H≦0.3 mm, and W≦0.3 mm, respectively, and terminal electrodes provided so as to cover the vertices of the element body and come round to the peripheral face of the element body from the end faces on both sides in the lengthwise direction, and the radius of curvature of the vertex of the terminal electrode that covers the vertex of the element body is set to a value being 10% or more and 20% or less of the length in the direction of height (H) or the length in the direction of width (W).

In the present invention, since the radius of curvature of the vertex of the terminal electrode that covers the vertex of the element body is set to a value being 10% or more and 20% or less of H or W, it is unlikely that the surface mounted electronic component moves or rotates at the mounted position on a substrate and the occurrence of defective mounting thereof can be suppressed.

Moreover, the surface mounted electronic component according to the present invention comprises a rectangular parallelepiped element body whose length in the lengthwise direction (L), length in the direction of height (H), and length in the direction of width (W) are L≦0.6 mm, H≦0.3 mm, and W≦0.3 mm, respectively, and terminal electrodes provided so as to cover the vertices of the element body and come round to the peripheral face of the element body from the end faces on both sides in the lengthwise direction, and the radius of curvature of the vertex of the element body is set to a value being 5% or more and 15% or less of the length in the direction of height (H) or the length in the direction of width (W).

In the present invention, since the radius of curvature of the vertex of the element body is set to a value being 5% or more and 15% or less of H or W, the radius of curvature of the vertex of the terminal electrode that covers the vertex of the element body is determined accordingly Because of this, it is unlikely that a surface mounted electronic component moves or rotates at the mounted position on a substrate and the occurrence of defective mounting thereof can be suppressed.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The preferred embodiment of the present invention will be described below in detail with referring to the accompanying drawings. The same elements, or elements with the same function will be denoted by the same reference symbols in the description, without redundant description.

In the present embodiment, the present invention is applied to a multilayer inductor.

Figure 1:
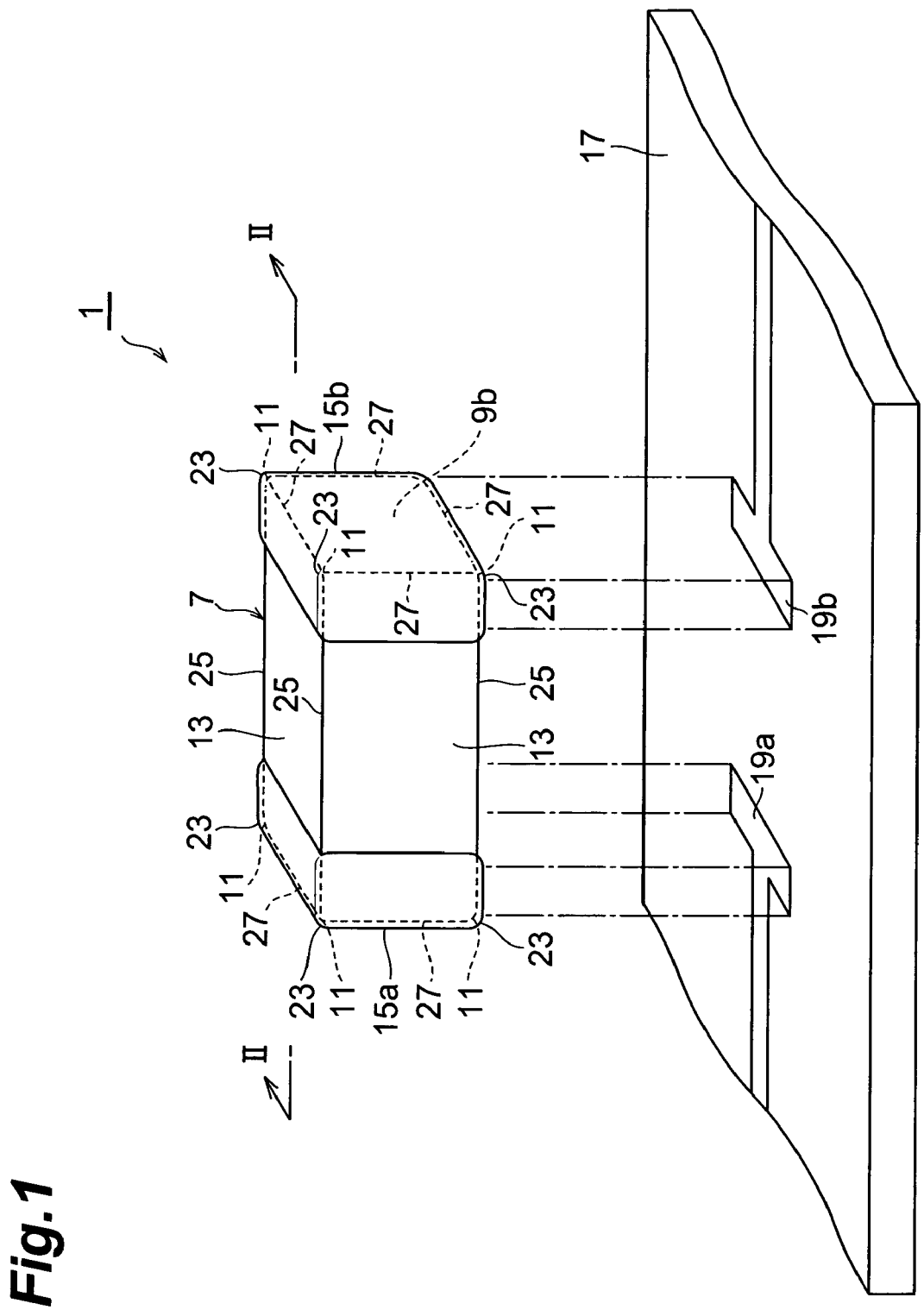
FIG. 1 is a perspective view illustrating a surface mounted electronic component and a mounting substrate according to the present embodiment.
Figure 2:
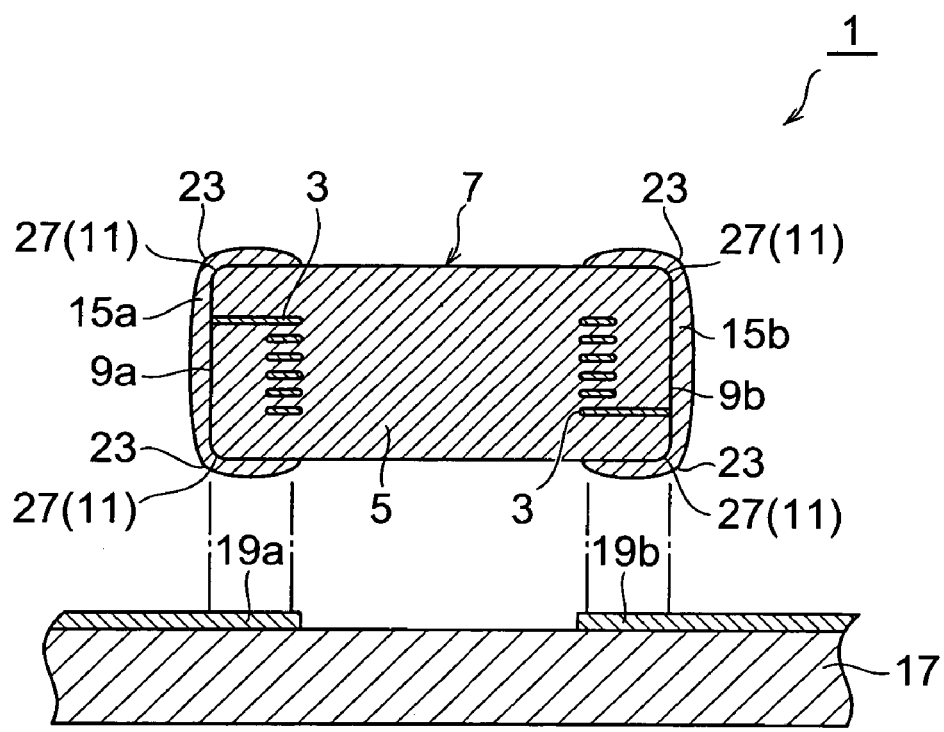
FIG. 2 is a sectional view along the 11—11 line in FIG. 1.

As shown in FIG. 1 and FIG. 2, a multilayer inductor 1 comprises an element body 7 and terminal electrodes 15a and 15b located on both end faces 9a and 9b in the lengthwise direction of the element body 7. The multilayer inductor 1 is mounted on a mounting substrate 17 for use in such a manner that its lengthwise direction and width direction are parallel to the surface of the mounting substrate 17. The mass of the multilayer inductor 1 is approximately 0.2 mg.

The element body 7 is a multilayer body composed of a plurality of laminated ceramic layers 5 provided with an internal electrode 3. The terminal electrodes 15a and 15b are formed so as to come round to a side face (peripheral face) 13 from both the end faces 9a and 9b in the lengthwise direction of the element body 7, covering the vertices (hereinafter, referred to as an "element body vertex") 11 of the element body 7. The element body 7 has a rectangular parallelepiped shape with the dimensions of a length in the lengthwise direction (L) of 0.6 mm, a length in the height direction (H) of 0.3 mm, and a length of width direction (W) of 0.3 mm. The multilayer inductor 1 is a surface mounted electronic component of so-called 0603 type. Hereinafter, the length in the lengthwise direction is referred to as a "length", the length in the height direction to as a "height", and the length in the width direction to as a "width".

Each of the internal electrodes 3 of the multilayer inductor 1 constitutes a coil by being electrically connected to each other inside the element body 7. The end of the internal electrode 3 located on one end of the coil is exposed to the end face 9a of the element body 7. The end of the internal electrode 3 located on the other end of the coil is exposed to the end face 9b of the element body 7. The terminal electrode 15a is electrically connected to the internal electrode 3 by contact with the internal electrode 3 located on the one end of the coil. The terminal electrode 15b is electrically connected to the internal electrode 3 by contact with the internal electrode 3 located on the other end of the coil. The terminal electrodes 15a and 15b are formed by plating Cu, Ni, and Sn on an underlying electrode made of silver.

The multilayer inductor 1 is mounted on the surface of the mounting substrate 17 by a process in which the terminal electrode 15a is aligned with a pad 19a and the terminal electrode 15b is aligned with a pad 19b and soldered thereto, respectively. In the multilayer inductor 1 mounted on the mounting substrate 17, the coil constituted of each of the internal electrodes 3 is electrically connected to the pads 19a and 19b via the terminal electrodes 15a and 15b. Due to this, it is possible for the multilayer inductor 1 to exhibit its function as an inductor on the mounting substrate 17.

Figure 3:
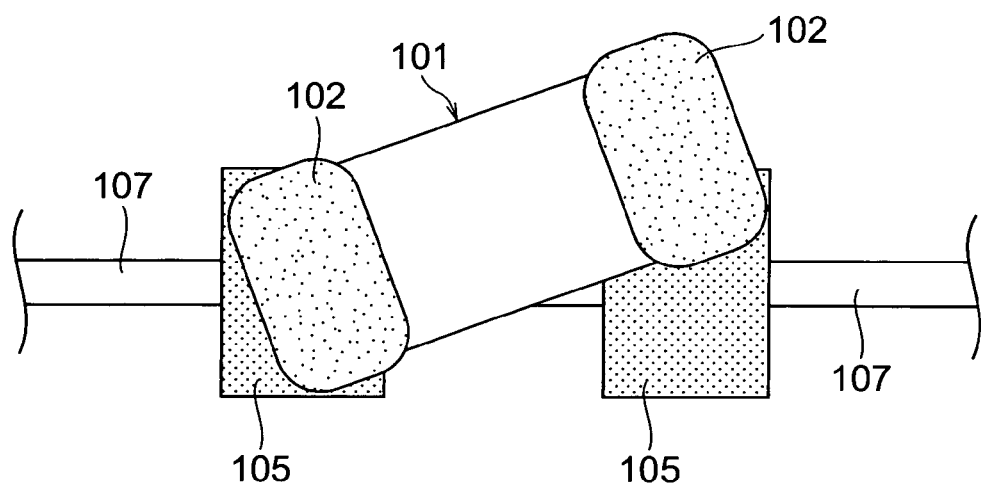
FIG. 3 is a diagram showing a state in which a conventional surface mounted electronic component is mounted.
Figure 3:
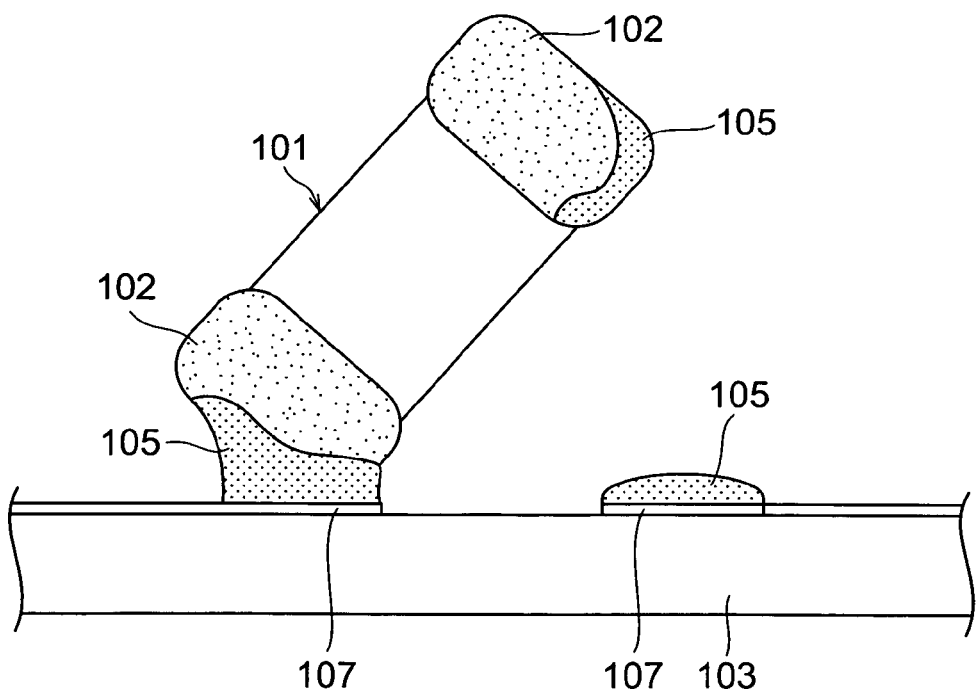

The mounting of the multilayer inductor 1 on the mounting substrate 17 is performed by a reflow soldering process. First, the terminal electrodes 15a and 15b are aligned and arranged on the pads 19a and 19b in such a manner so as to sandwich solder (cream solder). Then, the solder melts and hardens and thus the multilayer inductor 1 is soldered to the mounting substrate 17. Since the mass of the multilayer inductor 1 is light, it is likely to move on the melted solder and in some cases its position is changed on the mounting substrate 17 while the solder is in a melted state. There may be a case where the multilayer inductor 1 shifts its position by rotating on the mounting substrate 17 (hereinafter, referred to as "shifting". Refer to FIG. 3(*a*)). There may also be a case where the multilayer inductor 1 shifts its position by rotating in such a manner that one end of the multilayer inductor 1 becomes more distant from the mounting substrate 17 (hereinafter, referred to as "chip rise (tombstone)". Refer to FIG. 3(*b*)). If the solder hardens in a state in which the position of the multilayer inductor 1 is shifted, the mounting of the multilayer inductor 1 results in failure.

Particularly, an electronic component having the dimensions being equal to or smaller than those of the 0603 type has a mass lighter than that of a surface mounted electronic component of, for example, 1005 type (the dimensions of the element body are 1.0 mm×0.5 mm×0.5 mm, and the mass is approximately 1.2 mg) and is more likely to move and shift its position and the above-described rotating position shift likely occurs. If the chip rise (tombstone) occurs while solder is in a melted state and the solder hardens in such a state, an electrical connection between the multilayer inductor 1 and the mounting substrate 17 is not obtained. In this case, the multilayer inductor 1 loses its function as an inductor on the mounting substrate 17, therefore, it is essentially important to suppressing the phenomenon of the chip rise (tombstone phenomenon).

In the present embodiment, the value of the radius of curvature (hereinafter, denoted by "R") of vertices (hereinafter, referred to as "electrode vertices") 23 of the terminal electrodes 15a and 15b that cover the element body vertices 11 of the element body 7 is defined so as to fall in a predetermined range on the basis of the dimensions of the element body 7. In other words, the terminal electrodes 15a and 15b are formed in such a manner that the radius of curvature R of the electrode vertex 23 is equal to 10% or more and equal to 20% or less of the height (H) or the width (W) of the element body 7. Since H=W=0.3 mm for the multilayer inductor 1, the radius of curvature R is set so as to be 0.03 mm≦R≦0.06 mm.

Since the radius of curvature R of the electrode vertex 23 is defined so as to be 20% or less of the height (H) or the width (W) of the element body 7, the multilayer inductor 1 is stably arranged on the pads 19a and 19b and is unlikely to move on the melted solder. As described above, since the multilayer inductor 1 does not easily move while the solder is in a melted state, the occurrence of the above-mentioned defective mounting can be suppressed.

The reason that the lower limit of the radius of curvature R of the electrode vertex 23 is defined so as to be 10% or more of the height (W) or the width (W) of the element body 7 is as follows. It is necessary to form the terminal electrodes 15a and 15b so that the thickness thereof is thin in order to reduce the radius of curvature R of the electrode vertex 23. When the thickness of the terminal electrodes 15a and 15b is 8 μm or less, it is no longer possible for the terminal electrodes 15a and 15b to maintain sufficient solder dip resistance, therefore, there is the possibility that a solder erosion of the terminal electrodes 15a and 15b occurs in the reflow soldering process. If there exists a thin part (approximately 2 μm) on the underlying electrode of the terminal electrodes 15a and 15b, some parts on the underlying electrode are not plated with Cu, Ni, or Sn, therefore, there is the possibility that the solderability of the terminal electrodes 15a and 15b is deteriorated. As described above, if the radius of curvature R is too small, trouble occurs because of the thin thickness of the terminal electrodes 15a and 15b, therefore, the lower limit of the radius of curvature R of the electrode vertex 23 is defined. As for the multilayer inductor 1, the radius of curvature R of the electrode vertex 23 is defined so as to be 10% or more of the height (H) or the width (W) of the element body 7, therefore, the solder erosion or deterioration in solderability of the terminal electrodes 15a and 15b can be suppressed.

Next, a method for manufacturing the multilayer inductor 1 is explained below.

First, the element body 7 in a green state is manufactured by a widely known method (for example, the sheet lamination method) so that the dimensions after burning are 0.6 mm×0.3 mm×0.3 mm. The obtained element body 7 in the green state is introduced into a barrel machine together with pure water and barrel polishing is performed for a predetermined time. In the element body 7 after the barrel polishing, a corner 25 at which the side faces 13 intersect and a corner 27 at which the side face 13 and the end faces 9a and 9b intersect are polished and rounded off, resulting in an R-shape. At this time, the radius of curvature of the corner 25 and the corner 27 is 5% or more and 10% or less of a height $H_0$ (equal to a width $W_0$, in this case) of the element body before firing. At this time, the radius of curvature (hereinafter, denoted by "$r_0$") of the element body vertex 11 at which the corner 25 and the corner 27 intersect is also 5% or more and 10% or less of the height $H_0$ or the width $W_0$. The radius of curvature $r_0$ is adjusted by appropriately setting the time for the barrel polishing. In general, the longer the barrel time is, the greater the radius of curvature $r_0$ becomes.

After this, the element body 7 having undergone the barrel polishing is fired. The radius of curvature of both the corner 25 and the corner 27 of the element body 7 obtained after firing is 5% or more and 15% or less of the height (H) or the width (W) of the element body. The greater the radius of curvature of the corner 25 and the corner 27 before firing is, the greater the radius of curvature of the corner 25 and the corner 27 after firing becomes. After firing, the element body vertex 11, at which the corner 25 and the corner 27 intersect, has the same radius of curvature as that of the corner 25 and the corner 27. In other words, in the element body 7 after firing, the radius of curvature (hereinafter, denoted by "r") of the element body vertex 11 is 5% or more and 15% or less of the height (H or the width (W). Here, it is much preferable that the radius of curvature r of the element body vertex 11 is to be 5% or more and 10% or less of the height (H) or the width (W).

After this, a sliver paste, the viscosity of which has been adjusted, is arranged on both ends of the element body 7 so as to contact with the internal electrode 3 and the silver paste is baked at 700° C. By baking, the silver paste is formed into the underlying electrodes of the terminal electrodes 15a and 15b. The surface of the underlying electrode is electrically plated sequentially with Cu, Ni, Sn, etc. to form the terminal electrodes 15a and 15b and thus the multilayer inductor 1 is completed. The radius of curvature R of the electrode vertex 23 of the completed multilayer inductor 1 is 10% or more and 20% or less of the height (H) or the width (W) of the element body.

In the above-mentioned manufacturing method, there is a correlation between the radius of curvature R of the electrode vertex 23 and the radius of curvature r of the element body vertex 11, and the greater the radius of curvature r of the element body vertex 11 is, the greater the radius of curvature R of the electrode vertex 23 becomes. The radius of curvature R of the electrode vertex 23 is also in a correlation with the viscosity of the silver paste used for forming the underlying electrode, and the higher the viscosity of the silver paste is, the greater the radius of curvature R becomes. In the above-mentioned manufacturing method, it is possible to easily adjust the radius of curvature R of the electrode vertex 23 to a value being 10% or more and 20% or less of the height (H) or the width (W) without extremely changing the viscosity of the silver paste, by setting the radius of curvature r of the element body vertex 11 to a value being 5% or more and 15% or less (much preferably, 5% or more and 10% or less) of the height (H) or the width (W).

In the embodiment described above, the present invention is applied to the multilayer inductor 1 of 0603 type, but the present invention may be applied to a smaller surface mounted electronic component of 0402 type (the dimensions of the element body are 0.4 mm×0.2 mm×0.2 mm and mass is approximately 0.08 mg). Moreover, the present invention may be applied to a capacitor, thermistor, varistor, and filter (composite component), not limited to a multilayer inductor, as long as the surface mounted electronic component has an element body and terminal electrodes located on both ends of the element body.

In the present embodiment, the radius of curvature r of the element body vertex 11 is adjusted by adjusting the time for barrel polishing and based on the adjustment of the radius of curvature r, the radius of curvature R of the electrode vertex is adjusted. However, not limited to this, the radius of curvature R of the electrode vertex may be adjusted to a value being 10% or more and 20% or less of the height (H) or the width (W) by physically machining the electrode vertex (for example, polishing).

In the present embodiment described above also, the height (H) and the width (W) are equal, but when the height (H) and the width (W) are different, the dimension of the radius of curvature R of the electrode vertex may be determined on the basis of the height (H) or the width (W).

Next, an experiment was conducted, in which a plurality of samples of multilayer inductors of 0603 type and 0402 type having various radii of curvature R were manufactured by appropriately adjusting the radius of curvature R of the electrode vertex and were mounted on a mounting substrate by reflow soldering.

Samples of multilayer inductors having various radii of curvature R were manufactured and 12,000 pieces of samples were prepared in accordance with each radius of curvature R. Tens of mounting substrates capable of mounting 1,200 multilayer inductors on each were prepared and 12,000 pieces of samples having the respective radii of curvature R were mounted on the respective substrates. The radius of curvature r of the element body vertex of the samples used at that time was set to a fixed value of 7% of the width W of the element body (20 to 22 µm for 0603 type and 13 to 15 µm for 0402 type), and the radius of curvature R of each sample was adjusted by adjusting the viscosity of the silver paste constituting the material of the terminal electrode.

Reflow soldering was performed in a $N_2$ reflow furnace set under predetermined reflow conditions. In accordance with the reflow conditions, the peak temperature was set to 250° C. and the reflow time was set to 10 seconds. The solder used is Sn—Ag—Cu base lead-free solder. After the reflow soldering process was performed, visual inspection of all the samples was conducted and the number of samples in which defective mounting occurred owing to shifting and chip rise (tombstone) was counted. The solder erosion and the poor solderability were checked for by visually inspecting the samples in which such a defect occurred.

The above-mentioned experiment was conducted for the two kinds of multilayer inductor of 0603 type and of 0402 type and the result of the experiment is shown in the following table. Table 1 represents the result of the experiment of the 0603 type and Table 2 represents the result of the experiment of the 0402 type, respectively. In Table 1 and Table 2, the radius of curvature R is expressed by percentage on the basis of the width (W) of the element body as well as by the actual dimension (in units of µm). As for the solder erosion and the poor solderability, the presence or absence of the occurrence is expressed by ○ or x (○: present, x: absent).

TABLE 1

| SAMPLE NO. | RADIUS OF CURVATURE R [%] | RADIUS OF CURVATURE R [μM] | SHIFTING (NUMBER OF NGs/TOTAL NUMBER OF SAMPLES) | CHIP RISE (NUMBER OF NGs/TOTAL NUMBER OF SAMPLES) | SOLDER EROSION | SOLDER ABILITY DEFECT |
|---|---|---|---|---|---|---|
| 1 | 8 | 23–25 | 0/12000 | 0/12000 | x | x |
| 2 | 10 | 28–32 | 0/12000 | 0/12000 | ○ | ○ |
| 3 | 12 | 34–38 | 0/12000 | 0/12000 | ○ | ○ |
| 4 | 15 | 43–47 | 0/12000 | 0/12000 | ○ | ○ |
| 5 | 17 | 48–54 | 6/12000 | 0/12000 | ○ | ○ |
| 6 | 20 | 57–63 | 14/12000 | 0/12000 | ○ | ○ |
| 7 | 25 | 70–80 | 34/12000 | 11/12000 | ○ | ○ |
| 8 | 30 | 85–95 | 36/12000 | 24/12000 | ○ | ○ |

TABLE 2

| SAMPLE NO. | RADIUS OF CURVATURE R [%] | RADIUS OF CURVATURE R [μM] | SHIFTING (NUMBER OF NGs/TOTAL NUMBER OF SAMPLES) | CHIP RISE (NUMBER OF NGs/TOTAL NUMBER OF SAMPLES) | SOLDER EROSION | SOLDER ABILITY DEFECT |
|---|---|---|---|---|---|---|
| 1 | 8 | 15–17 | 0/12000 | 0/12000 | x | x |
| 2 | 10 | 18–22 | 0/12000 | 0/12000 | ○ | ○ |
| 3 | 12 | 22–26 | 0/12000 | 0/12000 | ○ | ○ |
| 4 | 15 | 28–32 | 0/12000 | 0/12000 | ○ | ○ |
| 5 | 17 | 32–36 | 9/12000 | 0/12000 | ○ | ○ |
| 6 | 20 | 37–43 | 21/12000 | 0/12000 | ○ | ○ |
| 7 | 25 | 45–55 | 32/12000 | 18/12000 | ○ | ○ |
| 8 | 30 | 55–65 | 31/12000 | 27/12000 | ○ | ○ |

As shown in Table 1 and Table 2, when the radius of curvature R becomes 25% or 30% of the width (W) of the element, a chip rise (tombstone) defect occurs in both the 0603 type and the 0402 type.

When the radius of curvature R becomes 8% of the width (W) of the element, the solder erosion and the poor solderability occur in both the 0603 type and the 0402 type. The number of samples in which the solder erosion occurred was 18 out of 12,000. The result of the analysis of the 18 defective samples in which the solder erosion occurred showed that the thickness of the terminal electrode of the defective sample was less than 12 μm (approximately 8 μm). The number of samples in which the poor solderability occurred was 29 out of 12,000. The result of the analysis of the samples in which the poor solderability occurred showed that some parts where the underlying electrode of the terminal electrode was too thin (approximately, 2 μm in thickness) were observed in 20 defective samples out of 29.

It is known that a shifting defect occurs in both the 0603 type and the 0402 type when the radius of curvature R becomes 17% or more of the width (W) of the element. In the present experiment, it was not found that the electrical connection with the mounting substrate was broken in any one of the shifting defect samples. This means that the shifting defect can be thought as an insignificant defective mounting.

From the above result, it was confirmed that the radius of curvature R is preferably set to a value being 10% or more and 20% or less of the width (W) of the element from the standpoint of suppressing defective mounting of a surface mounted electronic component. Further, it was also confirmed that it is much preferable to set the radius of curvature R to a value being 10% or more and 15% or less of the width (W) of the element in order to suppress the shifting defect from occurring. Furthermore, it was confirmed that the dimension of the radius of curvature R may be set to a value being 10% or more and 20% or less (much preferably, being 10% or more and 15% or less) of the height (H) on the basis of the height (H) of the element because the width (W) and the height (H) of the multilayer inductor used in the present experiment are substantially the same.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A surface mounted electronic component comprising:
    a rectangular parallelepiped element body whose length in the lengthwise direction (L), length in the direction of height (H), and length in the direction of width (W) are L≦0.6 mm H≦0.3 mm, and W≦0.3 mm, respectively; and
    terminal electrodes provided so as to cover the vertices of the element body and come round to the peripheral face of the element body from the end faces on both sides in the lengthwise direction,
    wherein the radius of curvature of the vertex of the terminal electrode that covers the vertex of the element body is set to a value being 10% or more and 15% or less of the length in the direction of height (H) or the length in the direction of width (W).

2. A surface mounted electronic component comprising:
    a rectangular parallelepiped element body whose length in the lengthwise direction (L), length in the direction of height (H), and length in the direction of width (W) are L≦0.6 mm H≦0.3 mm, and W≦0.3 mm, respectively; and terminal electrodes provided so as to cover the vertices of the element body and come round to the peripheral face of the element body from the end faces on both sides in the lengthwise direction, wherein the radius of curvature of the vertex of the element body is set to a value being 5% or more and 15% or less of the length in the direction of height (H) or the length in the direction of width (W).

* * * * *